US012707562B2

(12) United States Patent
Su et al.

(10) Patent No.: US 12,707,562 B2
(45) Date of Patent: Aug. 11, 2026

(54) MICRO LIGHT-EMITTING PACKAGE

(71) Applicant: Lextar Electronics Corporation, Hsinchu (TW)

(72) Inventors: Hsin-Lun Su, Hsinchu (TW); Jo-Hsiang Chen, Hsinchu (TW); Chun-Min Lin, Hsinchu (TW)

(73) Assignee: Ennostar Corporation, Hsinchu City (TW)

( * ) Notice: Subject to any disclaimer, the term of this patent is extended or adjusted under 35 U.S.C. 154(b) by 253 days.

(21) Appl. No.: 18/424,225

(22) Filed: Jan. 26, 2024

(65) Prior Publication Data

US 2024/0268019 A1 Aug. 8, 2024

(30) Foreign Application Priority Data

Feb. 4, 2023 (TW) ................................ 112103953

(51) Int. Cl.
*H05K 1/00* (2006.01)
*H05K 1/03* (2006.01)
*H05K 1/11* (2006.01)
*H05K 1/181* (2026.01)

(52) U.S. Cl.
CPC ............. *H05K 1/036* (2013.01); *H05K 1/116* (2013.01); *H05K 1/181* (2013.01); *H05K 2201/0212* (2013.01); *H05K 2201/10106* (2013.01)

(58) Field of Classification Search
CPC ........ H05K 1/036; H05K 1/116; H05K 1/181; H05K 2201/0212; H05K 2201/10106
See application file for complete search history.

(56) References Cited

U.S. PATENT DOCUMENTS 6,197,425 B1 * 3/2001 Sekimoto ............ H05K 3/4661 428/209
7,417,196 B2 8/2008 Wada et al.
10,154,597 B2 12/2018 Takeoka et al.
2022/0037571 A1 * 2/2022 Lin ..................... H10H 20/814

FOREIGN PATENT DOCUMENTS

CN 113410218 A 9/2021
CN 115692592 A 2/2023
WO WO-2018116502 A1 * 6/2018 .......... H05K 3/4697

* cited by examiner

*Primary Examiner* — Pete T Lee
(74) *Attorney, Agent, or Firm* — Patterson + Sheridan, LLP

(57) ABSTRACT

A micro light-emitting package is provided. The micro light-emitting package includes a multilayer resin wiring board, a plurality of micro LED chips, and an encapsulating layer. The multilayer resin wiring board includes a black resin structure and a conductive structure disposed in the black resin structure. The plurality of the micro LED chips is arranged on the multilayer resin wiring board and electrically-connected to the conductive structure. The encapsulating layer covers the plurality of the micro LED chips.

11 Claims, 9 Drawing Sheets

MICRO LIGHT-EMITTING PACKAGE

CROSS REFERENCE TO RELATED APPLICATIONS

This application claims the right of priority based on TW application Serial No. 112103953, filed on Feb. 4, 2023, which is incorporated by reference herein in its entirety.

FIELD OF DISCLOSURE

The present disclosure relates to a package, in particular to a light-emitting package including a multilayer resin wiring board.

BACKGROUND OF THE DISCLOSURE

Currently, micro LED display technology mainly uses red, green, and blue light-emitting diodes as three primary color light sources. A high ratio of an upper surface area of a black resin layer to an upper surface area of a substrate is usually required so that micro LED displays have better contrast, but there are metal wires formed on the substrate of conventional pixel package that can reduce the ratio of the upper surface area of the black resin layer to the upper surface area of substrate, the contrast is therefore reduced.

SUMMARY OF THE DISCLOSURE

The present disclosure provides a micro light-emitting package. The micro light-emitting package includes a multilayer resin wiring board, a plurality of micro LED chips, and an encapsulating layer. The multilayer resin wiring board includes a black resin structure and a conductive structure disposed in the black resin structure. The plurality of the micro LED chips is arranged on the multilayer resin wiring board and electrically-connected to the conductive structure. The encapsulating layer covers the plurality of the micro LED chips.

DETAILED DESCRIPTION OF THE DISCLOSURE

Figure 1:
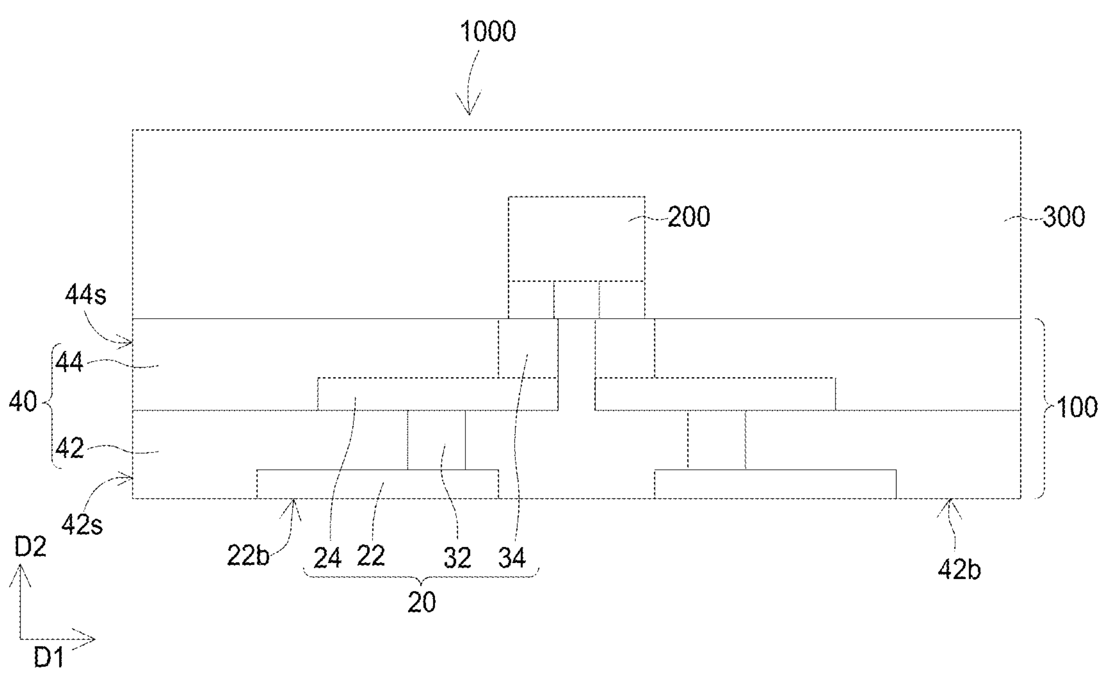
FIG. 1 shows a schematic sectional view of a micro light-emitting package in accordance with an embodiment of the present disclosure.

The following embodiments will be described with accompany drawings to disclose the concept of the present disclosure. In the drawings or description, same or similar portions are indicated with same or similar numerals. Furthermore, a shape or a size of a member in the drawings may be enlarged or reduced. Particularly, it should be noted that a member which is not illustrated or described in drawings or description may be in a form that is known by a person skilled in the art.

FIG. 1 shows a schematic sectional view of a micro light-emitting package in accordance with an embodiment of the present disclosure. Referring to FIG. 1, a micro light-emitting package 1000 includes a multilayer resin wiring board 100, a plurality of micro LED chips 200, and an encapsulating layer 300. The multilayer resin wiring board 100 includes a black resin structure 40 and a conductive structure 20 disposed in the black resin layer. The plurality of the micro LED chips 200 is arranged on the multilayer resin wiring board 100 and electrically connected to the conductive structure 20. The encapsulating layer 300 covers the plurality of the micro LED chips 200.

In some embodiments, the micro LED chips 200 may emit red, green, or blue light, but the present disclosure is not limited thereto. In some embodiments, the micro LED chips 200 may also emit ultraviolet light, but the present disclosure is not limited thereto. In some embodiments, the micro LED chip 200 includes a quantum dot light-emitting diode.

Referring to FIG. 1, in some embodiments, the multilayer resin wiring board 100 includes the black resin structure 40 and the conductive structure 20. In some embodiments, the black resin structure 40 includes a black resin layer. The conductive structure 20 comprises a plurality of stacked conductive layers and via conductors, which are embedded inside the black resin structure 40. In some embodiments, the conductive structure 20 includes a first conductive layer 22, a second conductive layer 24, a first via conductor 32, and a second via conductor 34. In some embodiments, the black resin structure 40 includes a first black resin layer 42 and a second black resin layer 44. The first black resin layer 42 covers an upper surface and a side surface of the first conductive layer 22, and the first via conductor 32 goes through the first black resin layer 42 and electrically connects with the first conductive layer 22. The second conductive layer 24 is disposed on the first black resin layer 42, and the second conductive layer 24 electrically connects with the first via conductor 32 and the second conductive layer 24. The second black resin layer 44 covers the second conductive layer 24, and the second via conductor 34 goes through the second black resin layer 44 and electrically connects with the second conductive layer 24.

In some embodiments, the black resin structure 40 includes thermoplastic resin, for example, polyphthalamide (PPA) or Polycyclohexylenedimethylene terephthalate (PCT). In some embodiments, the black resin structure 40 includes thermosetting resin, for example, silicone molding compound (SMC) or epoxy molding compound (EMC). In some embodiments, the black resin structure 40 includes polyamide9T (PA9T), but the present disclosure is not limited thereto.

In some embodiments, the black resin structure 40 includes the first black resin layer 42 and the second black resin layer 44, in which the first black resin layer 42 and the second black resin layer 44 include carbon black. Carbon block concentration of the first black resin layer 42 and the second black resin layer 44 are respectively between weight percentages 2% to 5%, for example, 2%, 3%, 4%, or 5%, but the present disclosure is not limited thereto.

In some embodiments, the encapsulating layer 300 includes carbon black, in which the carbon black concentration of the encapsulating layer 300 in weight percentage is between 0.1% to 2%, for example, 0.1%, 0.3%, 0.5%, 0.7%, 0.9%, 1.1%, 1.5%, 1.7% or 2%, but the present disclosure is not limited thereto.

Figure 2:
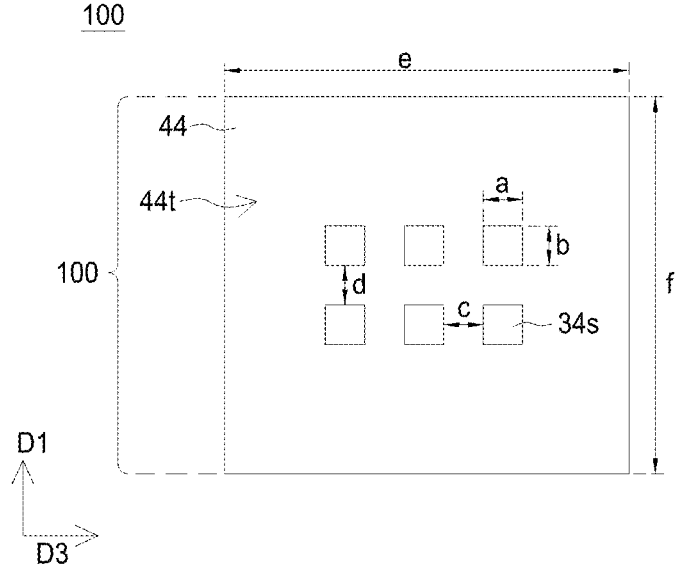
FIG. 2 shows a top view of a multilayer resin wiring board in accordance with an embodiment of the present disclosure.
Figure 20:
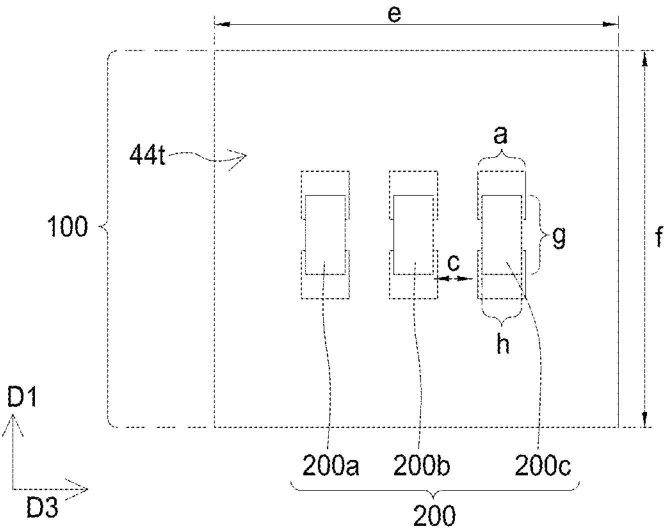
FIG. 20 shows a top view of micro LED chips arranged on the multilayer resin wiring board in accordance with an embodiment of the present disclosure.

FIG. 2 shows a top view of the multilayer resin wiring board 100 in accordance with an embodiment of the present disclosure. In some embodiments, a width a of an upper surface of the second via conductor 34*s* is 20 μm to 50 μm, and a length b of the upper surface of the second via conductor 34*s* is 20 μm to 50 μm. In some embodiments, along the first direction D1, a distance d between the upper surface of each second via conductor 34 is 20 μm to 50 μm. Along the first direction D3, a distance c between the upper surface of each second via conductor 34 is 20 μm to 50 μm. A width e of the multilayer resin wiring board 100 is 200 μm to 500 μm, and a length f of the multilayer resin wiring board 100 is 200 μm to 500 μm. In some embodiments, the micro light-emitting package 1000 includes six upper surfaces of the second via conductor 34*s*. The second via conductor 34 is surrounded by the second black resin layer 44, and six upper surfaces of the second via conductors 34*s* are respectively uncovered by the upper surface of the second black resin layer 44*t*. Referring to FIG. 20, two electrode pads 200*p* of the micro LED chip 200 (not shown) are respectively electrically connected to the upper surfaces of two second via conductors 34*s* having the distance d between each other along the first direction D1. Each of the adjacent micro LED chips 200 electrically connected to the upper surfaces of two second via conductors 34*s* has the distance c between each other.

In some embodiments, an area of the upper surface of the second black resin layer 44*t* is an area of an upper surface of the multilayer resin wiring board 100 minus a total area of the six upper surfaces of the second via conductors 34*s*. A ratio of the area of the upper surface of the second black resin layer 44*t* to the area of the upper surface of the multilayer resin wiring board 100 is between 93% and 97%. The ratio of the area of the upper surface of the second black resin layer 44*t* to the area of the upper surface of the multilayer resin wiring board 100 defines a black ratio. That is, the black ratio is 93% to 97%. For example, the black ratio may be 93%, 94%, 95%, 96%, or 97%, but the present disclosure is not limited thereto. The first via conductor 32, the second conductive layer 24, and the second via conductor 34 are surrounded by the black resin structure 40, and only the upper surfaces of the second via conductors 34*s* are exposed. From the top view of the multilayer resin wiring board 100, the metal wires of the first via conductor 32 and the second conductive layer 24 cannot be observed. Thus, the black ratio greatly increases and the contrast of the display is enhanced.

In some embodiments, the length f of the multilayer resin wiring board 100 is 450 μm, and the width e of the multilayer resin wiring board 100 is 450 μm. The area of the upper surface of the multilayer resin wiring board 100 is 202500 μm2. The width a of the upper surface of the second via conductor 34*s* is 45 μm, and the length b of the upper surface of the second via conductor 34 is 45 μm. The area of the six upper surfaces of the second via conductor 34*s* is 12150 μm2. The area of the upper surface of the second black resin layer 44*t* is the area of the upper surface of the multilayer resin wiring board 100 minus the total area of the six upper surfaces of the second via conductors 34*s*. The area of the upper surface of the second black resin layer 44*t* is 190350 μm2. The ratio of the area of the upper surface of the second black resin layer 44*t* to the area of the upper surface of the multilayer resin wiring board 100 is 94%. That is, the black ratio is 94%.

Figure 3:
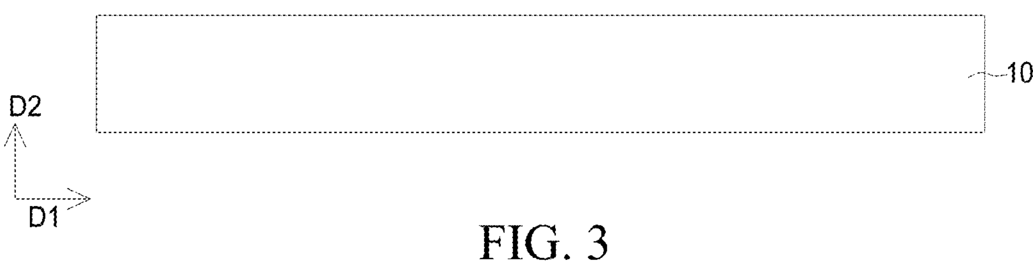
FIGS. 3-11 show schematic cross-sectional views at different stages of forming the micro light-emitting package of FIG. 1 in accordance with some embodiments of the present disclosure.

FIGS. 3-11 are schematic cross-sectional views at different stages of forming the micro light-emitting package 1000 in accordance with some embodiments of the present disclosure. Referring to FIG. 3, a temporary substrate 10 is provided in some embodiments. In some embodiments, the temporary substrate 10 may include polyethylene terephthalate (PET), polyimide (PI), polypropylene (PP), or polycarbonate (PC), but the present disclosure is not limited thereto. In some embodiments, the temporary substrate 10 may include sapphire, quartz, or glass, but the present disclosure is not limited thereto. In some embodiments, the temporary substrate 10 may include a wafer, but the present disclosure is not limited thereto. In some embodiments, the temporary substrate 10 may include ceramic, but the present disclosure is not limited thereto.

Figure 4:
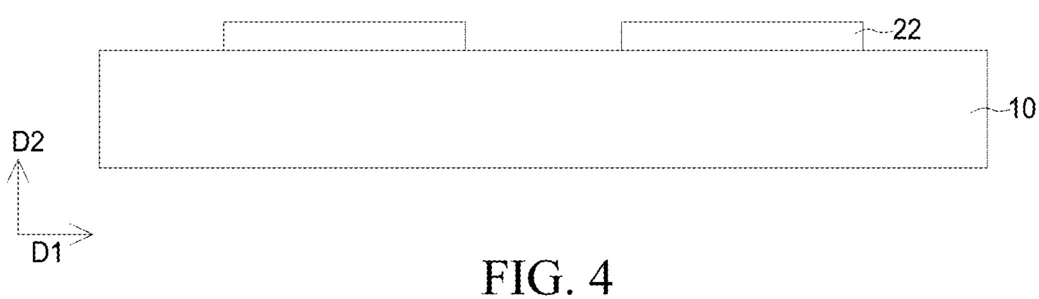

Referring to FIG. 4, the first conductive layer 22 is formed on the temporary substrate 10. In some embodiments, the first conductive layer 22 is formed by atomic layer deposition (ALD), chemical vapor deposition (CVD), physical vapor deposition (PVD), high-density plasma CVD (HDP-CVD), spin coating, electroplating process, sputtering, low-pressure chemical vapor deposition (LPCVD), or low-temperature chemical vapor deposition (LTCVD), but the present disclosure is not limited thereto. In some embodiments, the first conductive layer 22 may be copper, aluminum, or iron, but the present disclosure is not limited thereto.

Figure 5:
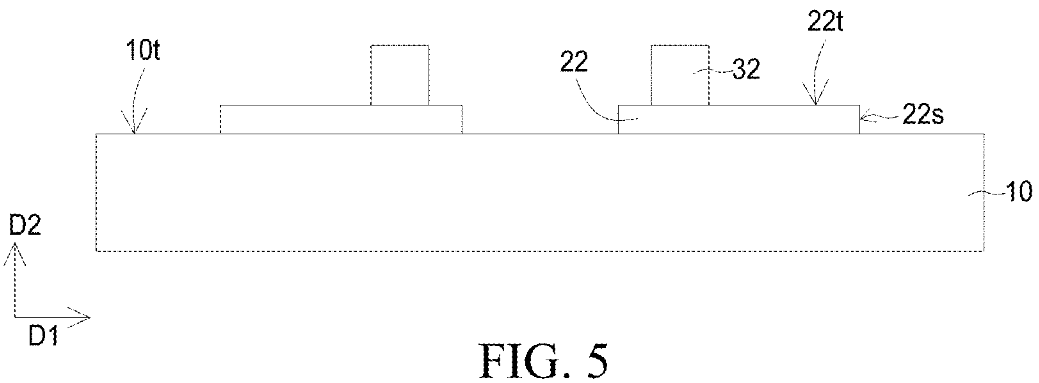

Referring to FIG. 5, in some embodiments, the first via conductor 32 is formed on the first conductive layer 22, the first via conductor 32 is in contact with the first conductive layer 22, and the first via conductor 32 extends toward the second direction D2. In some embodiments, the first via conductor 32 is electrically connected to the first conductive layer 22. In some embodiments, the first via conductor 32 is formed on the first conductive layer 22 by atomic layer deposition (ALD), chemical vapor deposition (CVD), physical vapor deposition (PVD), high-density plasma CVD (HDP-CVD), spin coating, electroplating process, sputtering, low-pressure chemical vapor deposition (LPCVD), or low-temperature chemical vapor deposition (LTCVD), but the present disclosure is not limited thereto. In some embodiments, the first via conductor 32 may be copper, aluminum, or iron, but the present disclosure is not limited thereto.

Figure 6:
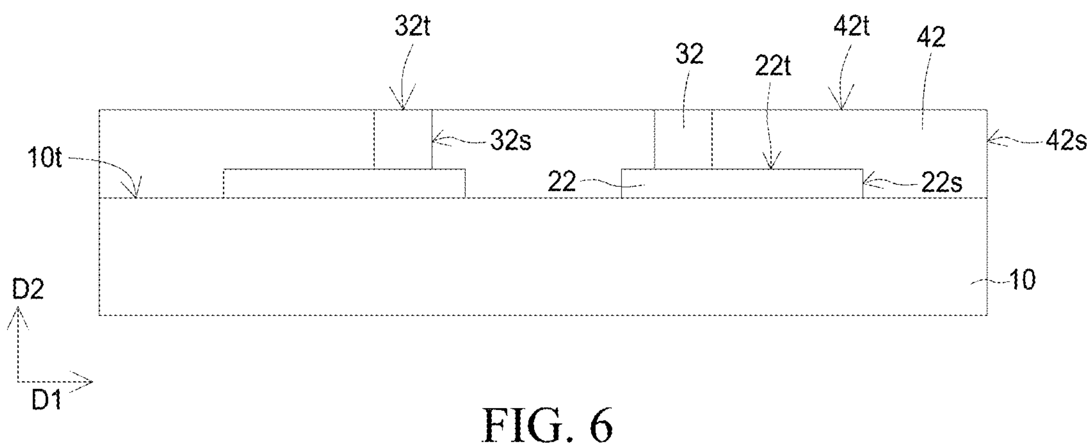

Referring to FIG. 6, in some embodiments, the first black resin layer 42 is formed on an upper surface of the temporary substrate 10*t*, a side surface of the first conductive layer 22*s*, an upper surface of the first conductive layer 22*t*, and a side surface of the first via conductor 32*s*. The upper surfaces of the first via conductors 32*t* are exposed. In some embodiments, an upper surface of the first black resin layer 42*t* is substantially flush with the upper surface of the first via conductor 32*t*. In some embodiments, the first black resin layer 42 is formed on the temporary substrate 10, the first conductive layer 22, and the first via conductor 32, and exposes the upper surface of the first via conductor 32*t*. In some embodiments, the first black resin layer 42 may be formed by molding, lamination, coating process, or other suitable forming processes. In some embodiments, the first black resin layer 42 includes thermoplastic resin, for example, polyphthalamide (PPA) or Polycyclohexylenedimethylene terephthalate (PCT). In some embodiments, the first black resin layer 42 includes thermosetting resin, for example, silicone molding compound (SMC) or epoxy molding compound (EMC). In some embodiments, the first black resin layer 42 includes polyamide9T (PA9T), but the present disclosure is not limited thereto.

Figure 7:
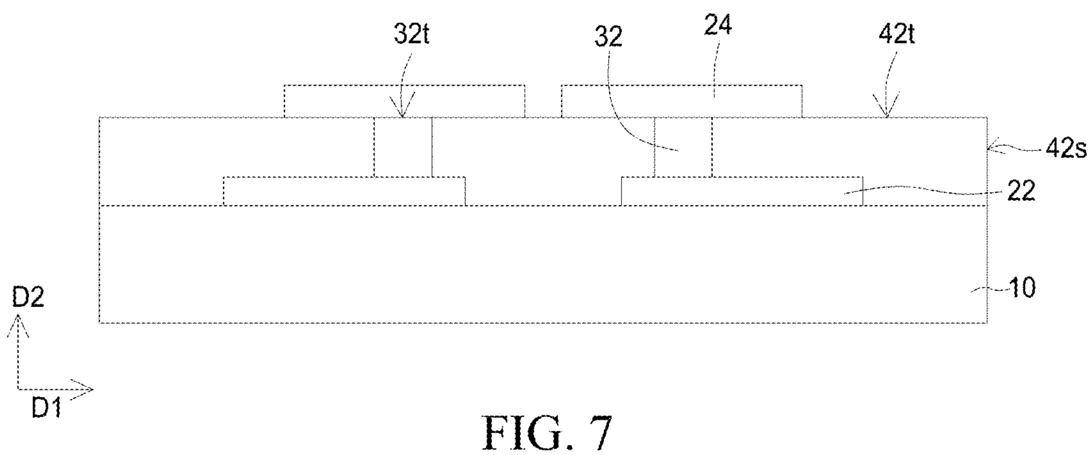

Referring to FIG. 7, in some embodiments, the second conductive structure 24 is formed on the upper surface of the first black resin layer 42*t* and the upper surface of the first via conductor 32*t*. The upper surface of the first via conductor 32*t* is in contact with the second conductive layer 24. Specifically, the first via conductor 32 is in electrical contact with the second conductive layer 24. In some embodiments, the second conductive layer 24 is formed on the upper surface of the first black resin layer 42*t* and the upper surface of the first via conductor 32*t* by atomic layer deposition (ALD), chemical vapor deposition (CVD), physical vapor deposition (PVD), high-density plasma CVD (HDP-CVD), spin coating, electroplating process, sputtering, low-pressure chemical vapor deposition (LPCVD), or low-temperature chemical vapor deposition (LTCVD), but the present disclosure is not limited thereto. In some embodiments, the second conductive layer 24 maybe copper, aluminum, or iron, but the present disclosure is not limited thereto.

Figure 8:
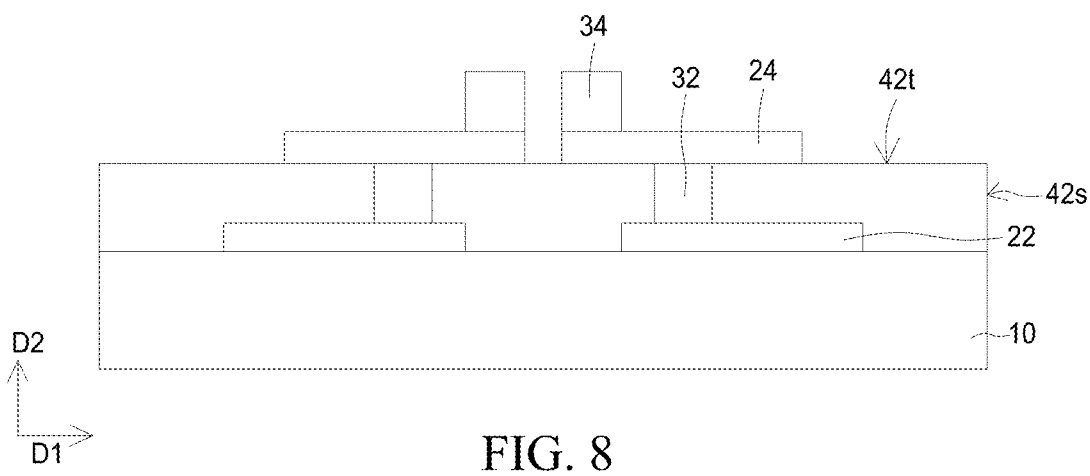

Referring to FIG. 8, in some embodiments, the second via conductor 34 is formed on the second conductive layer 24. The second via conductor 34 is in contact with the second conductive layer 24, and the second via conductor 34 extends toward the second direction D2. In some embodiments, the second via conductor 34 is electrically connected to the second conductive layer 24. In some embodiments, the second via conductor 34 is formed on the second conductive layer 24 by atomic layer deposition (ALD), chemical vapor deposition (CVD), physical vapor deposition (PVD), high-density plasma CVD (HDP-CVD), spin coating, electroplating process, sputtering, low-pressure chemical vapor deposition (LPCVD), or low-temperature chemical vapor deposition (LTCVD), but the present disclosure is not limited thereto. In some embodiments, the second via conductor 34 may be copper, aluminum, or iron, but the present disclosure is not limited thereto.

Figure 9:
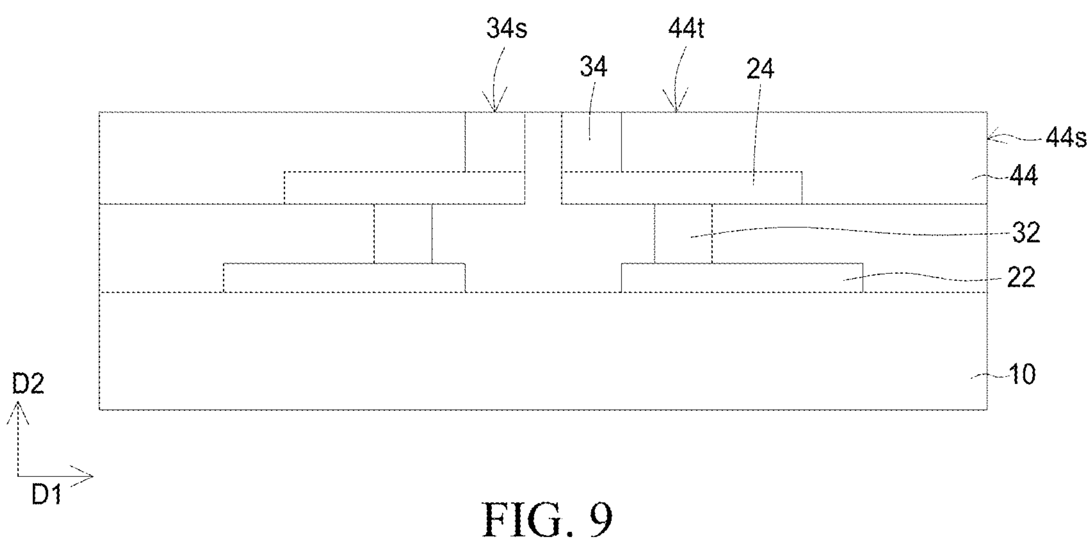

Referring to FIG. 9, in some embodiments, the second black resin layer 44 is formed on the upper surface of the first black resin layer 42*t*, a side surface and a top surface of the second conductive layer 24, and a side surface of the second via conductor 34. The upper surfaces of the second via conductors 34*s* are uncovered by the upper surface of the second black resin layer 44*t*. In some embodiments, the second black resin layer 44 and the upper surfaces of the second via conductors 34*s* are polished by a polisher.

Referring to FIG. 9, in some embodiments, the second black resin layer 44 has the upper surface 44*t*, and the second via conductor 34 has the upper surface 34*s* not covered by the upper surface of the second black resin layer 44*t*. The upper surfaces of the second via conductors 34*s* are substantially coplanar with the upper surface of the second black resin layer 44*t*.

The upper surfaces of the second via conductors 34*s*, which are substantially flush with the upper surface of the second black resin layer 44*t*, serve as a die-bonding area. The micro LED chips are electrically connected to the upper surfaces of the second via conductors 34*s*. In some embodiments, the second black resin layer 44 is formed on the first black resin layer 42, the second conductive layer 24, the second via conductor 34, and exposes the upper surfaces of the second via conductor 34*s*. In some embodiments, the second black resin layer 44 may be formed by molding, lamination, coating process, or other suitable forming processes. In some embodiments, the second black resin layer 44 includes thermoplastic resin, for example, polyphthalamide (PPA) or Polycyclohexylenedimethylene terephthalate (PCT). In some embodiments, the second black resin layer 44 includes thermosetting resin, for example, silicone molding compound (SMC) or epoxy molding compound (EMC). In some embodiments, the second black resin layer 44 includes polyamide9T (PA9T), but the present disclosure is not limited thereto. In some embodiments, the first black resin layer 42 and the second black resin layer 44 can be made together and regarded as one black resin layer having the plurality of stacked conductive layers and via conductors inside.

Figure 10:
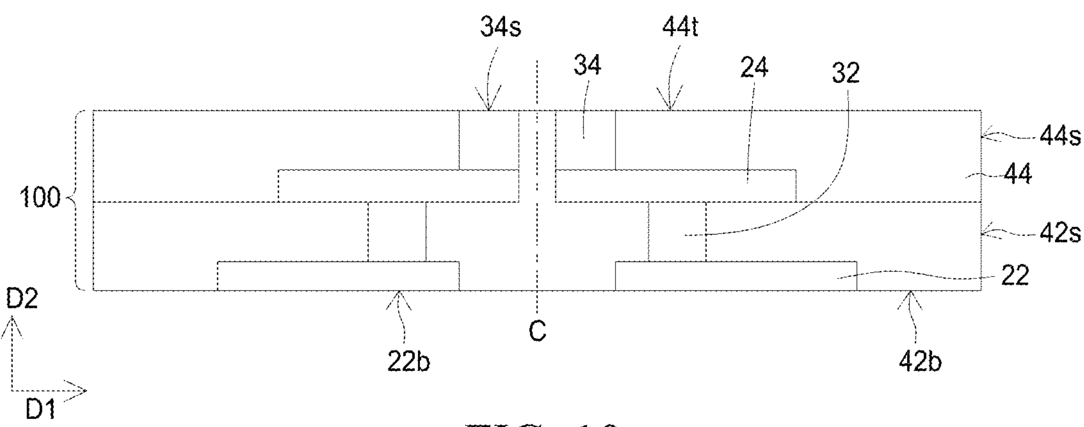

Next, referring to FIG. 10, a removal process is performed to remove the temporary substrate 10 from the first black resin layer 42. Thus, a lower surface of the first conductive layer 22*b* is not covered by a lower surface of the first black resin layer 42*b* and can serve as a soldering pad for the micro light-emitting package 1000. In some embodiments, the lower surface of the first black resin layer 42*b* is substantially flush with the lower surface of the first conductive layer 22*b*. In some embodiments, the removal process includes laser debonding, plasma etching, chemical etching, or other suitable removal processes. Finally, the multilayer resin wiring board 100 is formed.

Figure 11:
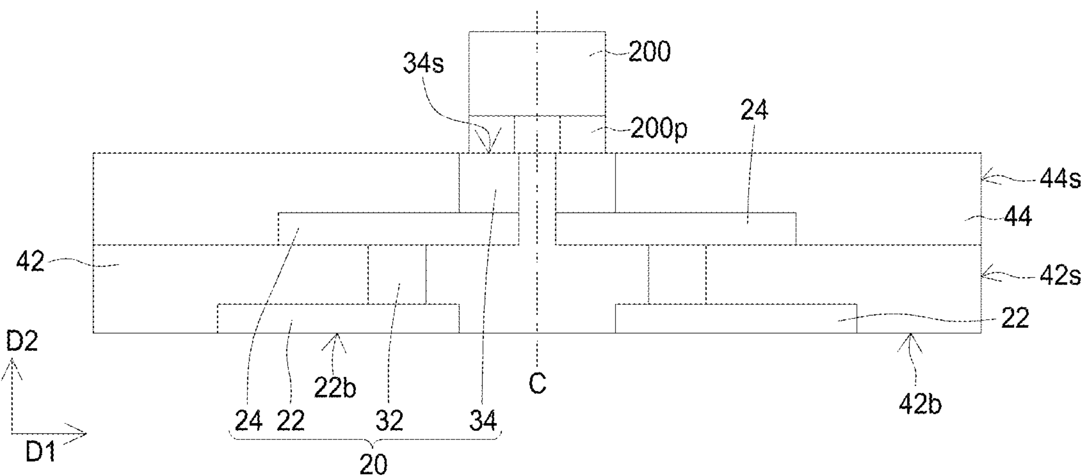

In some embodiments, the plurality of micro LED chips 200 is arranged on the upper surface of the multilayer resin wiring board 100 and electrically-connected to the conductive structure 20. FIG. 11 shows that one micro LED chip 200 is electrically-connected to the upper surfaces of the second via conductor 34*s*. However, more than one micro LED chip 200 may be respectively electrically-connected to the corresponding the upper surfaces of the second via conductor 34*s*. In some embodiments, the plurality of micro LED chips 200 is arranged side by side. Thus, electrode pads 200*p* of the micro LED chips 200 are electrically-connected to the upper surfaces of the second via conductor 34*s*. In some embodiments, the micro LED chips 200 are transferred onto the multilayer resin wiring board 100 by laser transfer or stamp transfer.

In some embodiments, the encapsulating layer 300 is formed on upper surfaces and side surfaces of the micro LED chips 200. Finally, the micro light-emitting package 1000 is formed as shown in FIG. 1. In some embodiments, the encapsulating layer 300 surrounds the micro LED chips 200. In some embodiments, the encapsulating layer 300 may include polysiloxane, epoxy molding compound (EMC), and liquid molding compound (LMC), but the present disclosure is not limited thereto. In some embodiments, the light transmittance of the encapsulating layer 300 may be greater than 90%. In some embodiments, a thickness of the encapsulating layer 300 is 20 μm to 90 μm, for example, 20 μm, 30 μm, 40 μm, 50 μm, 60 μm, 70 μm, 80 μm, or 90 μm.

During the transferring process, if the distance between the two electrode pads 200*p* of the micro LED chips 200 does not correspond to the distance d between upper surfaces of two second via conductor 34s, the yield of transferring micro LED chips 200 decreases. Referring to FIGS. 10 and 11, in some embodiments, the second via conductor 34 is closer to a centerline C of the multilayer resin wiring board 100 than the first via conductor 32 is. Thus, the distance between the two electrode pads 200p of the micro LED chips 200 is corresponding to the distance d (20 μm to 50 μm) between upper surfaces of two second via conductor 34s so that the yield of transferring the micro LED chips 200 is enhanced.

Referring to FIG. 1, in some embodiments, the first black resin layer 42 has the lower surface 42b, and the first conductive layer 22 has the lower surface 22b. The lower surface of the first black resin layer 42b is substantially coplanar with the lower surface of the first conductive layer 22b.

In some embodiments, the lower surface of the first conductive layer 22b may be slightly concave in the lower surface of the first black resin layer 42b by etching process and serves as the soldering pad of the micro light-emitting package 1000. The micro light-emitting package 1000 maybe electrically-connected to a panel substrate 400 (shown in FIG. 15) by the solder paste process.

Figure 12:
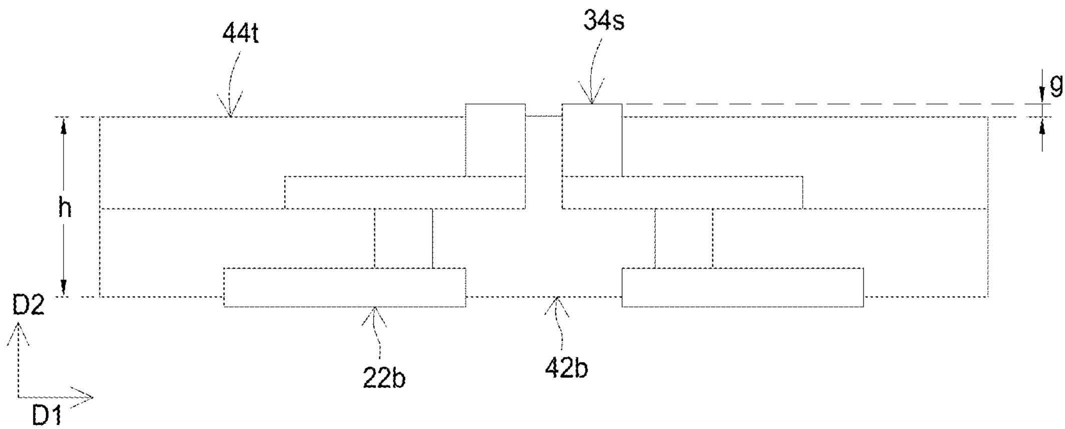
FIG. 12 shows a schematic sectional view of a multilayer resin wiring board in accordance with another embodiment of the present disclosure.

Referring to FIG. 12, in some embodiments, a thickness h of the multilayer resin wiring board 100 is 80 μm to 120 μm. A protrusion height g of the upper surface of each second via conductor 34s protruding from the upper surface of the second black resin layer 44t is in a range from 0 μm to 5 μm. This is, a distance between the upper surface of each second via conductor 34s and the upper surface of the second black resin layer 44t is in the range from 0 μm to 5 μm. In some embodiments, the protrusion height g may be formed by atomic layer deposition (ALD), chemical vapor deposition (CVD), physical vapor deposition (PVD), high-density plasma CVD (HDP-CVD), spin coating, electroplating process, sputtering, low-pressure chemical vapor deposition (LPCVD), or low-temperature chemical vapor deposition (LTCVD), but the present disclosure is not limited thereto.

Referring to FIG. 12, the lower surface of the first conductive layer 22b protrudes from the lower surface of the first black resin layer 42b. In some embodiments, referring to FIG. 12, the lower surface of the first conductive layer 22b may be thickened by electroplating so that the lower surface of the first conductive layer 22b protrudes from the lower surface of the first black resin layer 42b, and servers as the soldering pad of the micro light-emitting package 1000.

In some embodiments, the first black resin layer 42 includes a side surface of the first black resin layer 42s. The second black resin layer 44 includes a side surface of the second black resin layer 44s. The side surface of the first black resin layer 42s is substantially coplanar with the side surface of the second black resin layer 44s. Thus, a vertical plane perpendicular to the lower surface of the first black resin layer 42b is formed in the second direction.

In some embodiments, the first black resin layer 42 and the second black resin layer 44 may be the same material. In some embodiments, the first black resin layer 42 and the second black resin layer 44 may be a different material.

In some embodiments, the carbon block concentration of the first black resin layer 42 is the same as that of the second black resin layer 44. In some embodiments, the carbon block concentration of the first black resin layer 42 is different from that of the second black resin layer 44. In some embodiments, the carbon block concentration of the second black resin layer 44 is higher than that of the first black resin layer 42. In some embodiments, the carbon block concentration of the second black resin layer 44 is lower than that of the first black resin layer 42.

Figure 13:
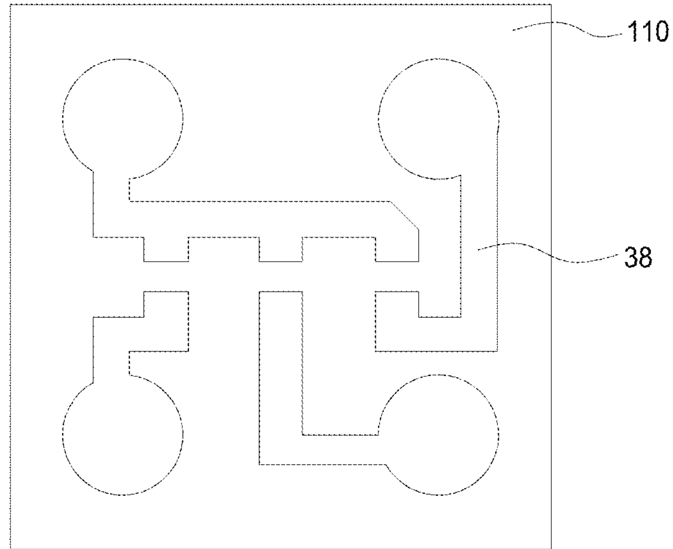
FIG. 13 shows a top view of a substrate of Comparative Example 1 of the present disclosure.

FIG. 13 shows a top view of a substrate of Comparative Example 1 of the present disclosure. Comparative Example 1 is the substrate of a conventional package of Comparative Example 1, which has a larger area taken by the metal wire 38 on a surface of the substrate. Thus, it reduces the black ratio of Comparative Example 1 of the conventional package, which is about 70% to 75%.

Figure 14:
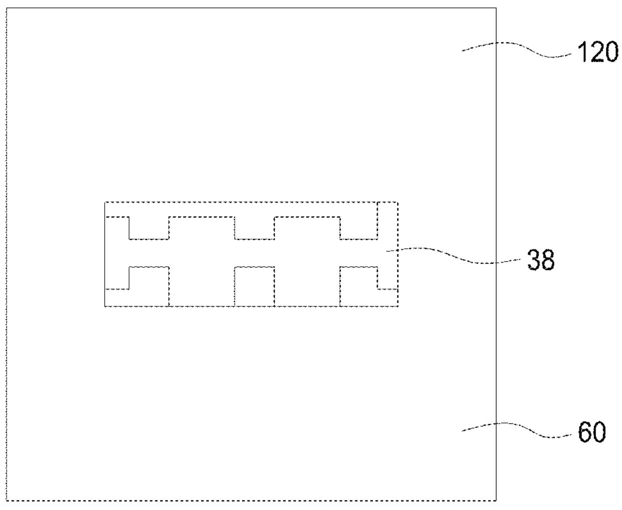
FIG. 14 shows a top view of a substrate of Comparative Example 2 of the present disclosure.

FIG. 14 shows a top view of a substrate of Comparative Example 2 of the present disclosure. The substrate 120 of a conventional package of Comparative Example 2 uses a black material layer 60 (black matrix) to cover metal wire (not shown) on the periphery of substrate 120, exposing part of the metal wire 38 in the middle of substrate 120. The black ratio of Comparative Example 2 of the conventional package is about 85% to 90%, but the reliability of the black material layer 60 is poor and can be peeled off easily. Thus, in Comparative Example 2, the yield rate of substrate 120 covered with the black material layer 60 is insufficient to be accepted.

According to Comparative Example 1 and Comparative Example 2, the metal wires are disposed of inside the multilayer resin wiring board 100 in the present disclosure. Thus, an exposed area of the metal wires is reduced, and only the upper surface of the second via conductor 34s is exposed as the die-bonding area. Therefore, the black ratio increases from 93% to 97%.

Figure 15:
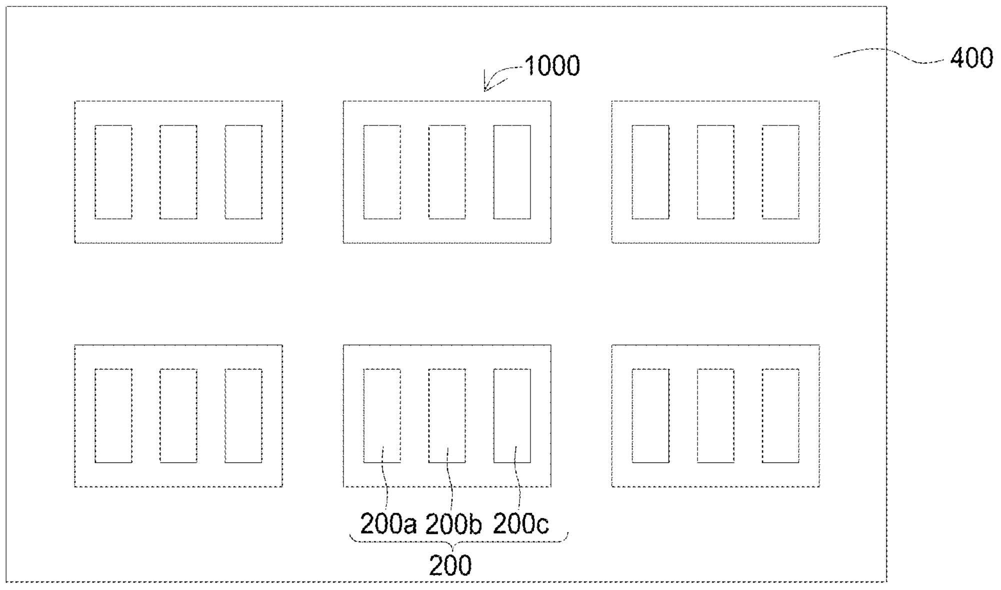
FIG. 15 shows a schematic plan view of a display device including an embodiment of the present disclosure.

FIG. 15 is a schematic plan view of a display device including an embodiment of the present disclosure. In some embodiments, a panel substrate 400 includes a plurality of micro light-emitting packages 1000. The plurality of micro light-emitting packages 1000 are arranged on the panel substrate 400. In some embodiments, the micro light-emitting packages 1000 are arranged in a matrix array. The matrix array may be constituted by 2×3 arrays on the panel substrate 400, but the present disclosure is not limited thereto. In some embodiments, the micro light-emitting packages 1000 are arranged on the panel substrate 400 in various matrix arrays such as 2×2, 3×2, 2×3, 3×3, 3×4, 5×5, 2×5 (An n×m matrix: n is column, m is row, n=1,2,3,4, 5 . . . , and m=1,2,3,4,5 . . . ).

FIG. 15 shows a schematic plan view of a display device including an embodiment of the present disclosure. Referring to FIG. 15, in some embodiments, each micro light-emitting package 1000 includes the plurality of micro LED chips 200 (200a, 200b, 200c). In some embodiments, the micro light-emitting package 1000 includes a first light-emitting diode 200a, a second light-emitting diode 200b, and a third light-emitting diode 200c. In some embodiments, as shown in FIG. 15, the first light-emitting diode 200a, the second light-emitting diode 200b, and the third light-emitting diode 200c may be arranged in a column or row in the micro light-emitting package 1000. In some embodiments, the first light-emitting diode 200a, the second light-emitting diode 200b, and the third light-emitting diode 200c may emit different color light. In some embodiments, the first light-emitting diode 200a may emit red light, the second light-emitting diode 200a may emit green light, and the third light-emitting diode 200a may emit blue light.

Figure 16:
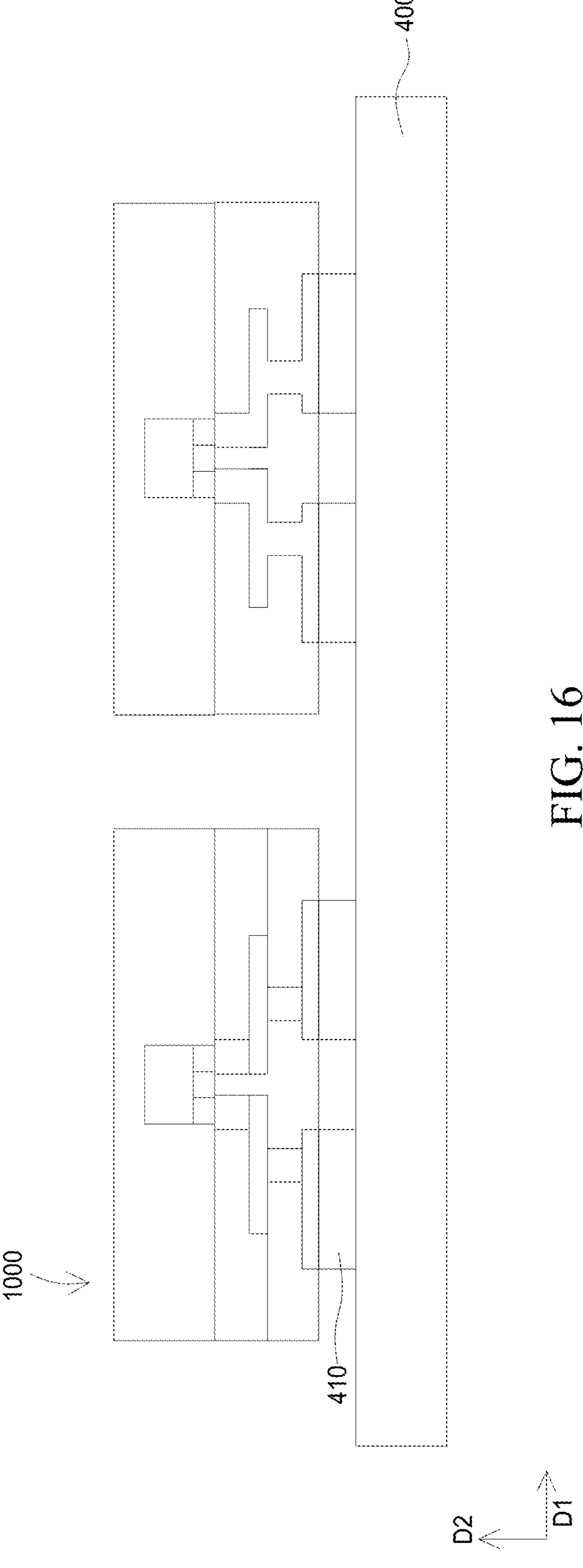
FIG. 16 shows a schematic sectional view of the display device including an embodiment of the present disclosure.

FIG. 16 shows a schematic sectional view of the display device including an embodiment of the present disclosure. FIG. 16 is the schematic sectional view of arranging the micro light-emitting packages 1000 on the panel substrate 400 in accordance with an embodiment of the present disclosure. Referring to FIG. 16, the micro light-emitting packages 1000 are arranged on the panel substrate 400 by bonding materials (not shown) in some embodiments.

Referring to FIG. 16, in some embodiments, the lower surface of the first conductive layer 22*b* as a soldering pad may be bonded to a bonding pad 410 on the panel substrate 400 by bonding materials in a bonding process, but the present disclosure is not limited thereto. In some embodiments, epoxy resin bonding, eutectic bonding, metal bonding, etc., may be used in the bonding process. The bonding pad 410 may be bonded correspondingly to the lower surface of the first conductive layer 22*b* of the micro light-emitting package 1000.

Referring to FIG. 16, in some embodiments, the panel substrate 400 may be glass, FR-4 glass epoxy, or polyimide (PI), but the present disclosure is not limited thereto. In some embodiments, the panel substrate 400 may be a circuit board, but the present disclosure is not limited thereto. The panel substrate 400 may include an active matrix drive circuit or a passive matrix drive circuit, but the present disclosure is not limited thereto. In some embodiments, a large display may be spliced by the plurality of panel substrate 400 where the micro light-emitting packages 1000 are arranged.

Figure 17:
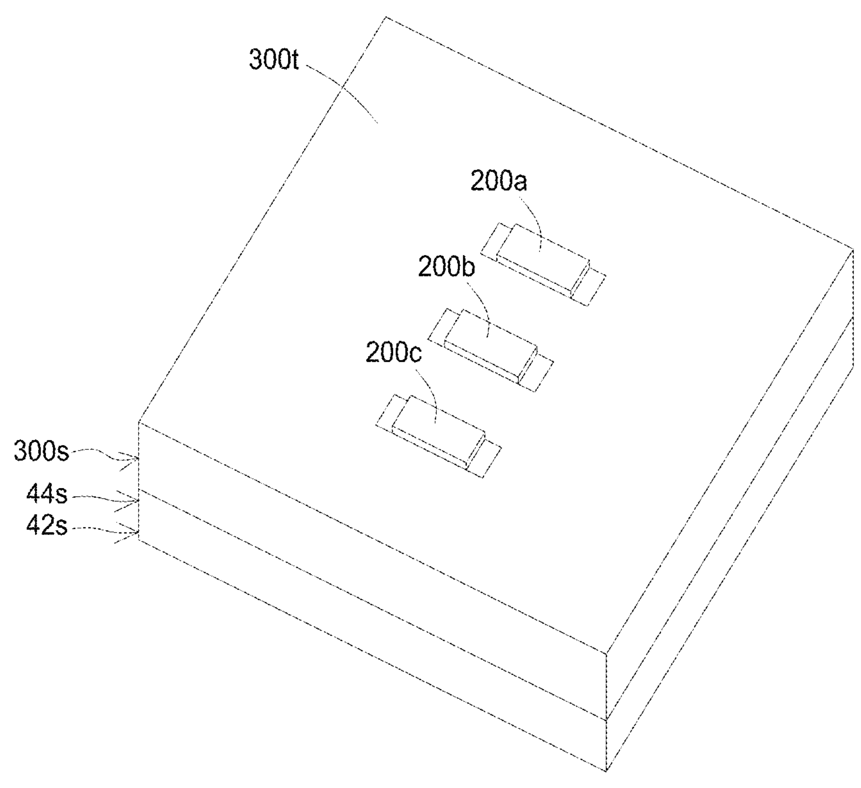
FIG. 17 shows a top perspective view of the micro light-emitting packages in accordance with an embodiment of the present disclosure.

FIG. 17 is a top perspective view of the micro light-emitting packages 1000 in accordance with an embodiment of the present disclosure. Referring to FIG. 17, in some embodiments, the encapsulating layer 300 includes an upper surface of the encapsulating layer 300*t* and a side surface of the encapsulating layer 300*s* and forms a rectangular or cubic package. In some embodiments, the vertical side surface of the encapsulating layer 300*s*, the side surface of the first black layer 42*s*, and the side surface of the second black layer 44*s* are substantially coplanar.

Figure 18:
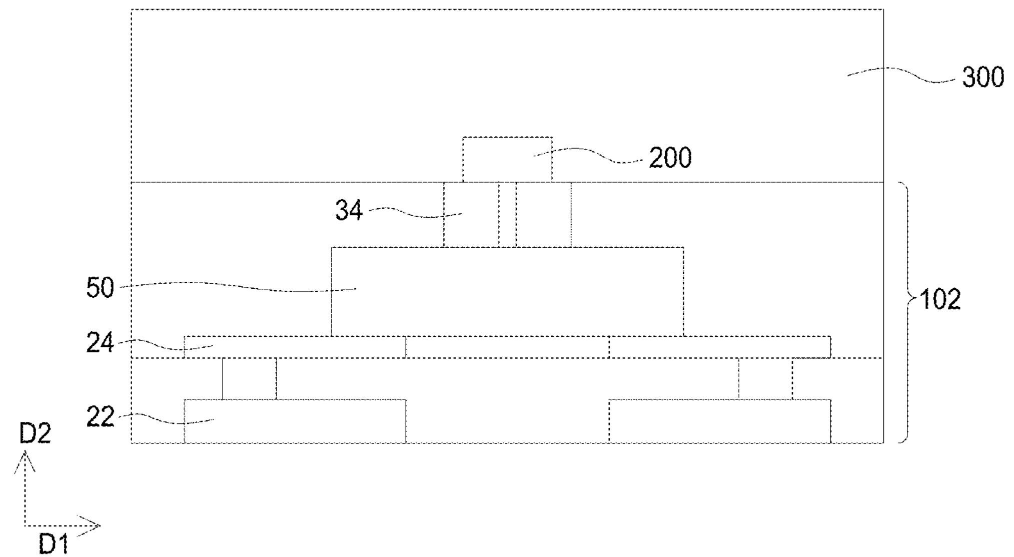
FIG. 18 shows a schematic sectional view of a micro light-emitting package in accordance with an embodiment of the present disclosure.

FIG. 18 is a schematic sectional view of a micro light-emitting package 2000 in accordance with an embodiment of the present disclosure. The same or similar component symbols in FIG. 18 and FIG. 1 represent the same or similar components. Referring to FIG. 18, in some embodiments, the difference between the micro light-emitting package 2000 and the micro light-emitting package 1000 is that the micro light-emitting package 2000 further includes a control element 50. That is, the difference between the multilayer resin wiring board 100 and a multilayer resin wiring board 102 is that the multilayer resin wiring board 102 further includes the control element 50. The control element 50 is arranged on the second conductive layer 24 and electrically connected to the second conductive layer 24. The second via conductor 34 is arranged on the control element 50 and electrically connected to the control element 50. The plurality of micro LED chips 200 are arranged on the multilayer resin wiring board 102 and electrically connected to the second via conductor 34. The encapsulating layer 300 covers the micro LED chips 200. In some embodiments, the control element 50 includes a micro drive integrated circuit device, a micro control integrated circuit device, or combinations of the above.

Figure 19:
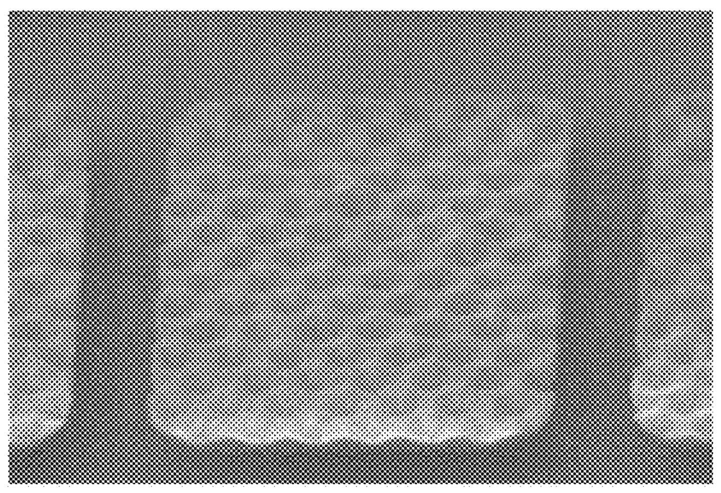
FIG. 19 shows an upper surface of the micro LED chip having concave and convex patterns in accordance with an embodiment of the present disclosure.

FIG. 19 is an upper surface (light-emitting surface) of the micro LED chip 200 having concave and convex patterns in accordance with an embodiment of the present disclosure. In some embodiments, the micro LED chip 200 lacks a sapphire substrate. The sapphire substrate includes a patterned-sapphire substrate. After laser lift off the patterned-sapphire substrate, the light-emitting surface of the micro LED chip 200 has concave and convex patterns. The concave and convex patterns may be periodically arranged. Thus, it may enhance light extraction and adjust the view angle of the micro LED chip 200.

FIG. 20 is a top view of micro LED chips 200 arranged on the multilayer resin wiring board 100 in accordance with an embodiment of the present disclosure. Referring to FIG. 2, in some embodiments, a ratio of the total area of the six upper surfaces of the second via conductor 34*s* to the upper surface of the multilayer resin wiring board 100 is between 3% and 6%. That is, the ratio of die bonding area to the upper surface of the multilayer resin wiring board 100 is 3%-6%, for example, 3%, 4%, 5%, or 6%. In some embodiments, the length f of the multilayer resin wiring board 100 may be 450 μm, and the width e of the multilayer resin wiring board 100 may be 450 μm. Thus, the area of the upper surface of the multilayer resin wiring board 100 is 202500 μm2. The width a of the second via conductor 34*s* is 45 μm, and the length b of the second via conductor 34*s* is 45 μm. The total area of the six upper surfaces of the second via conductor 34*s* is 12150 μm2. The ratio of the die bonding area to the upper surface of the multilayer resin wiring board 100 is 6%.

Referring to FIG. 20, in some embodiments, a ratio of the total area of the upper surface of the micro LED chips 200 to the area of the multilayer resin wiring board 100 is 1%-6%. That is, the chip area ratio may be between 1% and 6%. The chip area ratio may be 1%, 2%, 3%, 4%, 5, or 6%. In some embodiments, a length g of the micro LED chip 200 is between 10 μm to 90 μm. A width h of the micro LED chip 200 is between 10 μm to 50 μm. In some embodiments, the length g of the micro LED chip 200 is 80 μm, and the width h of the micro LED chip 200 is 40 μm. The micro LED chip 200 has the upper surface (light emitting surface). Thus, the total area of the upper surfaces of the micro LED chips 200 is 9600 μm2. The length f of the multilayer resin wiring board 100 is 450 μm, and the width e of the multilayer resin wiring board 100 is 450 μm. The area of the upper surface of the multilayer resin wiring board 100 is 202500 μm2. The ratio of the total area of the upper surface of the micro LED chips 200 to the area of the multilayer resin wiring board 100 is 4.7%. Because the micro LED chips 200 (200*a*, 200*b*, 200*c*) are electrically bonded to the upper surfaces of the second via conductor 34*s* (die bonding area), the micro LED chips 200 cover part of the upper surface of the second via conductors (such as covering half of the area of the upper surface of the micro LED chips 200). Thus, the portion of the upper surface of the second via conductors 34*s* can be observed from the outside and is limited to a smaller area.

In some embodiments, a ratio of the chip area ratio to the die bonding area may be between 0.3% and 2%. In some embodiments, the ratio of the chip area ratio to the die bonding area may be 0.4, 0.5, 0.6, 0.7, 0.78, 0.8, 0.9, 1.0, 1.1, 1.2, 1.3, 1.4, 1.5, 1.56, 1.6, 1.7, 1.8, or 1.9.

It should be realized that each of the embodiments mentioned in the present disclosure is used for describing the present disclosure, but not for limiting the scope of the present disclosure. Any obvious modification or alteration is not departing from the spirit and scope of the present disclosure. Furthermore, embodiments can be combined or substituted under proper condition and are not limited to specific embodiments described above. A connection relationship between a specific component and another component specifically described in an embodiment can also be applied in another embodiment and is within the scope as claimed in the present disclosure.

What is claimed is:

1. A micro light-emitting package, comprising:

a multilayer resin wiring board comprising:

a black resin structure; and a conductive structure disposed in the black resin structure and comprising a first conductive layer, a first via conductor, a second conductive layer with a topmost surface, and a second via conductor;

a plurality of micro LED chips arranged on the multilayer resin wiring board and electrically connected to the conductive structure; and an encapsulating layer covering the plurality of micro LED chips, wherein the topmost surface has a portion overlapping the first via conductor, and completely covered by the black resin structure in a vertical direction.

2. The micro light-emitting package of claim 1, wherein the black resin structure comprises a first black resin layer, and a second black resin layer having an upper surface.

3. The micro light-emitting package of claim 2, wherein:

the first black resin layer covers the first conductive layer;

the first via conductor penetrates the first black resin layer, and is electrically connected to the first conductive layer;

the second conductive layer is arranged on the first black resin layer, and electrically connected to the first via conductor;

the second black resin layer covers the second conductive layer; and the second via conductor has an upper surface, and penetrates the second black resin layer.

4. The micro light-emitting package of claim 3, wherein the upper surface of the second via conductor and the upper surface of the second black resin layer are coplanar with each other.

5. The micro light-emitting package of claim 3, wherein a distance between the upper surface of the second via conductor and the upper surface of the second black resin layer is in a range from 0 μm to 5 μm.

6. The micro light-emitting package of claim 3, wherein the multilayer resin wiring board has an upper surface, and a ratio of an area of the upper surface of the second black resin layer to an area of the upper surface of the multilayer resin wiring board is between 93% and 97%.

7. The micro light-emitting package of claim 3, wherein the second via conductor is closer to a centerline of the multilayer resin wiring board than the first via conductor is.

8. The micro light-emitting package of claim 3, wherein the first black resin layer has a lower surface, the first conductive layer has a lower surface as a soldering pad, and the lower surface of the first black resin layer is substantially coplanar with the lower surface of the first conductive layer.

9. The micro light-emitting package of claim 6, wherein a ratio of a total area of upper surfaces of the plurality of micro LED chips to the area of the upper surface of the multilayer resin wiring board is between 1% and 6%.

10. The micro light-emitting package of claim 6, wherein the plurality of micro LED chips comprises a micro LED chip which has a light-emitting surface, and the light-emitting surface has a concave and convex pattern.

11. The micro light-emitting package of claim 6, wherein the plurality of micro LED chips comprises a micro LED chip which is devoid of a sapphire substrate.

* * * * *